United States Patent
Furukawa et al.

(10) Patent No.: US 10,056,653 B2
(45) Date of Patent: Aug. 21, 2018

(54) BATTERY MANAGEMENT DEVICE AND POWER SUPPLY DEVICE

(71) Applicant: SANYO Electric Co., Ltd., Osaka (JP)

(72) Inventors: Kimihiko Furukawa, Hyogo (JP); Tomoyuki Matsubara, Hyogo (JP)

(73) Assignee: SANYO ELECTRIC CO., LTD., Osaka (JP)

( * ) Notice: Subject to any disclaimer, the term of this patent is extended or adjusted under 35 U.S.C. 154(b) by 286 days.

(21) Appl. No.: 15/030,020

(22) PCT Filed: Nov. 18, 2014

(86) PCT No.: PCT/JP2014/005766
§ 371 (c)(1),
(2) Date: Apr. 15, 2016

(87) PCT Pub. No.: WO2015/087487
PCT Pub. Date: Jun. 18, 2015

(65) Prior Publication Data
US 2016/0261007 A1    Sep. 8, 2016

(30) Foreign Application Priority Data

Dec. 10, 2013 (JP) ................................ 2013-255268

(51) Int. Cl.
*H01M 2/00* (2006.01)
*H01M 10/42* (2006.01)
(Continued)

(52) U.S. Cl.
CPC ........ *H01M 10/425* (2013.01); *G01R 31/026* (2013.01); *G01R 31/362* (2013.01);
(Continued)

(58) Field of Classification Search
CPC .. H01M 10/425; G01R 31/026; G01R 31/362
(Continued)

(56) References Cited

U.S. PATENT DOCUMENTS

2010/0286938 A1   11/2010   Kaneko
2010/0327878 A1   12/2010   Ishikawa et al.
2016/0261007 A1*  9/2016    Furukawa ............ G01R 31/362

FOREIGN PATENT DOCUMENTS

JP    2009-232671    10/2009
JP    2010-025824    2/2010
(Continued)

OTHER PUBLICATIONS

International Search Report of PCT application No. PCT/JP2014/005766 dated Feb. 24, 2015.

*Primary Examiner* — Abdullah Riyami
*Assistant Examiner* — Nader Alhawamdeh
(74) *Attorney, Agent, or Firm* — Wenderoth, Lind & Ponack, L.L.P.

(57) ABSTRACT

A plurality of cascade-connected voltage detection ICs detect each voltage of a plurality of battery cells connected in series and constituting an assembled battery, through a plurality of voltage detection lines. Power sources receive power from the assembled battery, for supplying power to the plurality of the voltage detection ICs. Communication lines connect between the plurality of the voltage detection ICs. A controlling circuit is connected to at least one of the plurality of the voltage detection ICs. First to third dummy resistors are connected to each of one or more of the voltage detection ICs which are not directly communicated to the controlling circuit out of the plurality of the voltage detection ICs. First to third switches turn on or off current supply through the first to third dummy resistors.

5 Claims, 4 Drawing Sheets

(51) Int. Cl.
    *G01R 31/36*         (2006.01)
    *G01R 31/02*         (2006.01)
    *H01M 10/48*         (2006.01)

(52) U.S. Cl.
    CPC .... *G01R 31/3658* (2013.01); *H01M 10/4285* (2013.01); *H01M 10/482* (2013.01); *H01M 2010/4271* (2013.01)

(58) Field of Classification Search
    USPC .......................................................... 429/61
    See application file for complete search history.

(56) References Cited

FOREIGN PATENT DOCUMENTS

| | | | |
|---|---|---|---|
| JP | 2011-007611 | 1/2011 | |
| JP | WO 2011135868 A1 * | 11/2011 | ............ B60L 3/0046 |
| JP | 2012-161182 | 8/2012 | |
| WO | 2011/135868 | 11/2011 | |

* cited by examiner

BATTERY MANAGEMENT DEVICE AND POWER SUPPLY DEVICE

CROSS-REFERENCE TO RELATED APPLICATIONS

This application is a U.S. national stage application of the PCT International Application No. PCT/JP2014/005766 filed on Nov. 18, 2014, which claims the benefit of foreign priority of Japanese patent application 2013-255268 filed on Dec. 10, 2013, the contents all of which are incorporated herein by reference.

TECHNICAL FIELD

The present invention relates to a battery management device for managing states of batteries, and power supply device equipped with the battery management device.

BACKGROUND ART

In recent years, hybrid vehicles (HV), plug-in hybrid vehicles (PHV), and electric vehicles (EV) are being spread. Secondary batteries as a key device are installed in these vehicles. As secondary batteries for the vehicle, the nickel hydride batteries and the lithium ion batteries are spread. In the future, it is expected that spread of the lithium ion batteries having high energy density are accelerated.

Since the operable voltage range and the prohibited voltage range in the lithium ion batteries are close, the stricter voltage management is necessary in the lithium ion batteries than other types of batteries. When an assembled battery in which a plurality of the lithium ion battery cells are connected in series is used, a voltage detection circuit is provided for detecting each of the battery cells. In a case where the number of the battery cells is large, a plurality of cascade-connected voltage detection circuits are used. The voltage detected in each of the battery cells is used for controlling of charge or discharge, equalization in the cell voltages, or the like.

Usually, it is designed that the power source for the plurality of the voltage detection circuits is supplied from the assembled battery. When it is designed that the power source is supplied from other than the assembled battery, a volume of the circuit is increased. In the following in this specification, the power source for the plurality of the voltage detection circuits is supplied from the assembled battery.

Detecting the disconnection of the voltage detection lines in the assembled battery is a required item of failure detection. When a current does not flow through the voltage detection line, it is difficult that the disconnection of such a line is detected. When the plurality of the voltage detection circuits are cascade-connected, in adjacent two of the voltage detection circuits, a ground terminal of the higher-potential side voltage detection circuit and a power source terminal of the lower-potential side detection circuit are connected, and its connected node and a node connected between the battery cells corresponding to the connected node are connected through the voltage detecting line In this case, a current flows from the higher-potential side voltage detection circuit to the lower-potential voltage side detection circuit. In some cases of this current value, it happens that a very little current flows through the voltage detecting line of the above-mentioned node between the battery cells. In a case where the disconnection of the voltage detection line happens in this state, it is difficult to detect the disconnection of the voltage detection line, because detected voltage values hardly change. In contrast, the impedance ratio between the adjacent voltage detection circuits is adjusted, and then a method that electric potential difference between both end of the voltage detection line is increased is proposed (for example, refer to Patent Literature 1).

CITATION LIST

Patent Literature

Patent Literature 1: Japanese Laid-Open Patent Publication No. 2011-7611

SUMMARY OF THE INVENTION

As mentioned above, if the current balance between the adjacent voltage detection circuits is broken, it becomes easy to detect the disconnection of the voltage detection line connected to the above-mentioned node between the battery cells. However, the balance of SOC (State Of Charge) between the battery cells supplying power to the voltage detection circuit having a large load current and the battery cells supplying power to the voltage detection circuit having a small load current, becomes apt to be broken.

At least one of the plurality of the voltage detection circuits cascade-connected is used for communicating to a controlling circuit including a microprocessor or the like. The voltage detection circuit communicated to the controlling circuit has larger consumption current than that of the voltage detection circuit not communicated to the controlling circuit. Therefore, the load of the battery cells supplying power to the voltage detection circuit communicated to the controlling circuit, becomes large, and then the SOC balance between the battery cells becomes apt to be broken.

The present invention is developed for the purpose of solving such requirements. The present invention provides a technology that detects, with a high degree of accuracy, a disconnection or break in voltage detection lines connected to an assembled battery and a plurality of cascade-connected voltage detection circuits and maintains an SOC balance between battery cells of the assembled battery.

To solve the above-mentioned requirements, a battery management device of one embodiment of the present invention has a plurality of cascade-connected voltage detection ICs for detecting each voltage of a plurality of battery cells connected in series and constituting an assembled battery, through a plurality of voltage detection lines. Power sources receive power from the assembled battery, for supplying power to the plurality of the voltage detection ICs. In adjacent two of the voltage detection ICs, a ground electric potential of the higher voltage side voltage detection IC and an electric potential of the power source of the lower voltage side detection IC are connected, and the connected node and a node connected between the battery cells corresponding to the connected node are connected through the voltage detecting line. Communication lines connect between the plurality of the voltage detection ICs. A controlling circuit is connected to at least one of the plurality of the voltage detection ICs through a communication line. A dummy resistor is connected to each of one or more of the voltage detection ICs which are not directly communicated to the controlling circuit out of the plurality of the voltage detection ICs. A switch turns on or off current supply through the dummy resistor. In the plurality of the voltage detection ICs, the at least one of the voltage detection ICs, which are directly communicated to the controlling circuit, is not connected to the dummy resistor and the switch turning on or off current supply through the dummy resistor.

According to the present invention, one embodiment detects, with a high degree of accuracy, a disconnection or break in voltage detection lines connected to an assembled battery and a plurality of cascade-connected voltage detection circuits and maintains an SOC balance between battery cells of the assembled battery.

DESCRIPTION OF EMBODIMENTS

Figure 1:
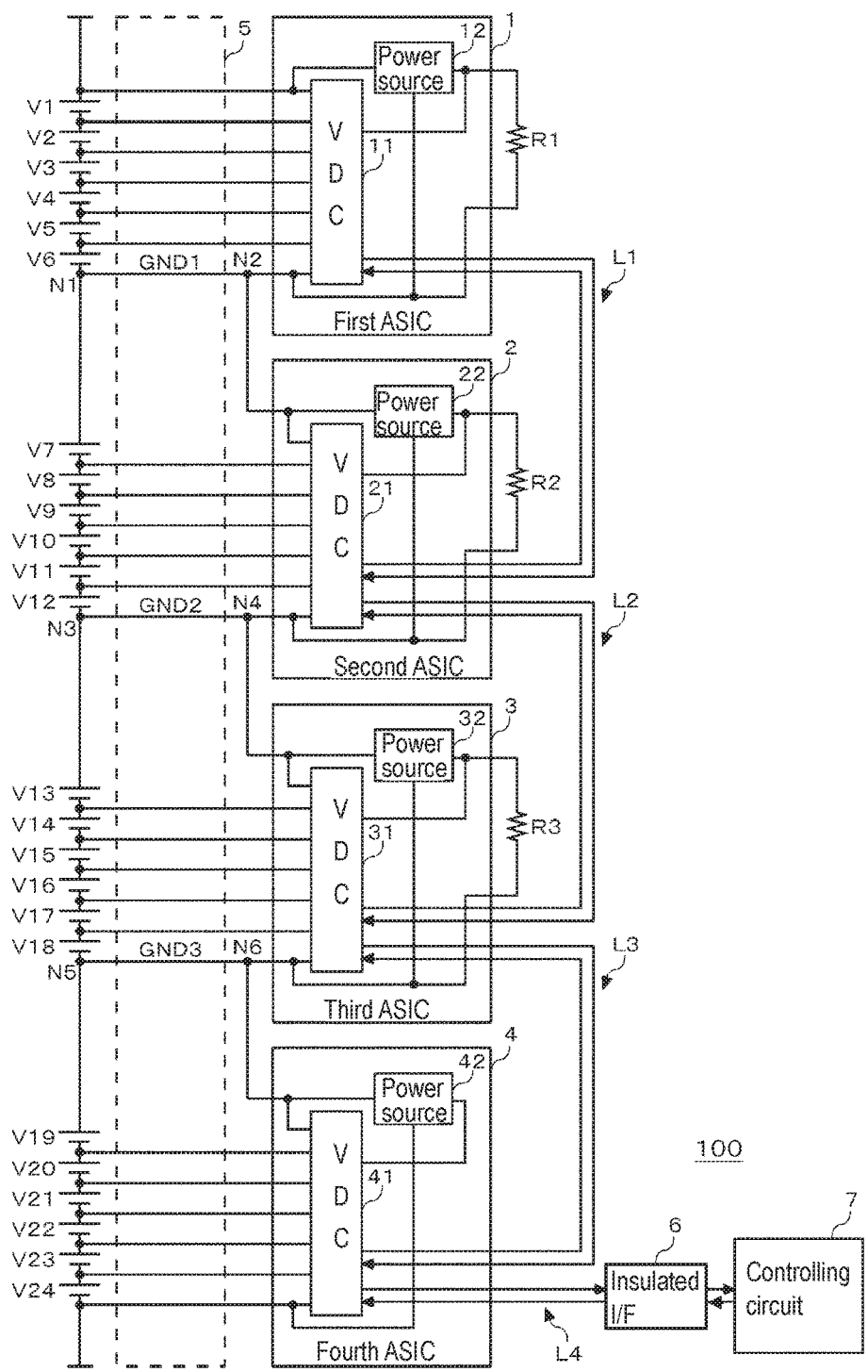
FIG. 1 is a figure showing a configuration of a power supply device relating to a comparative example.

FIG. 1 is a figure showing a configuration of a power supply device 100 relating to a comparative example. Power supply device 100 includes an assembled battery in which a plurality of battery cells are connected in series, and a plurality of ASICs (Application Specific Integrated Circuit), controlling circuit 7. In the following explanation, lithium ion batteries are used as battery cells. Normal output voltage of the lithium ion batteries changes based on materials, generally its range from 3.0 V to 5.0 V inclusive is designed. In this specification, the lithium ion batteries connected in 24 series constitutes the assembled battery. This number of series is one example for explaining. An assembled battery installed in hybrid vehicles or electric vehicles mainly has 200 V or more. In such an assembled battery, the number of lithium ion battery cells connected in series is 60 or more.

The plurality of ASICs are cascade-connected. The number of cells which can be managed by one ASIC is limited, and the plurality of ASICs are cascade-connected in a case of an assembled battery in which a lot of battery cells are connected in series. In this specification, one ASIC can manage at least 6 battery cells. Then, four of ASICs are cascade-connected. Namely, first to sixth battery cells V1 to V6 are managed by first ASIC1, and seventh to twelve battery cells V7 to V12 are managed by second ACIC2, and thirteen to eighteen battery cells V13 to V18 are managed by third ASIC3, and nineteen to twenty-fourth battery cells V19 to V24 are managed by fourth ASIC4.

First ASIC 1 includes first voltage detection circuit 11 (described as "VDC" in the figures) and first power source circuit 12. Second ASIC 2 includes second voltage detection circuit 21 (described as "VDC" in the figures) and second power source circuit 22. Third ASIC 3 includes third voltage detection circuit 31 (described as "VDC" in the figures) and third power source circuit 32. Fourth ASIC 4 includes fourth voltage detection circuit 41 (described as "VDC" in the figures) and fourth power source circuit 42.

First to fourth voltage detection circuits 11 to 41 detect each voltage of series-connected first to twenty-fourth battery cells V1 to V24 through wire harness 5 including wires (hereinafter refer to as "voltage detection line") First voltage detection circuit 11 is connected to the highest electric potential side node of first battery cell V1, the node between first battery cell V1 and second battery cell V2, the node between second battery cell V2 and third battery cell V3, the node between third battery cell V3 and fourth battery cell V4, the node between fourth battery cell V4 and fifth battery cell V5, the node between fifth battery cell V5 and sixth battery cell V6, and the node between sixth battery cell V6 and seventh battery cell V7, by the voltage detection lines, respectively. Then, first voltage detection circuit 11 detects the electric potential of each node. In the same way, second to fourth voltage detection circuit 21 to 41 also are respectively connected to the corresponding node, and then detect the electric potential of each node.

First to fourth ASICs 1 to 4 receive power (or power source supply) from the assembled battery, for its operation. In the vehicle use, the auxiliary battery (generally, 12 V system) can provides power, but the wiring from the auxiliary battery becomes long, and then loss also becomes large. Further, a volume of the circuit is also increased. Therefore, generally, the power sources of first to fourth ASICs 1 to 4 are provided from the assembled battery which the corresponding ASICs manage. For example, in first ASIC 1 the voltage detection line connected to the node of the high electric potential side in first battery cell V1 is used as a power source supply line. Then, the voltage detection line connected to the node between sixth battery cell V6 and seventh battery cell V7 is used as a ground line. Accordingly, the output voltage as a power source voltage of first to sixth battery cells V1 to V6 is supplied to first ASIC 1. The power source voltage is also supplied from the corresponding battery cells in second to fourth voltage detection circuits 21 to 41, respectively.

The adjacent ASICs are connected and communicated through communication lines L1 to L3 in cascade-connected first to fourth ASICs 1 to 4. In the adjacent two ASICs, the ground terminal of the high voltage side ASIC and the power source terminal of the low voltage side ASIC are connected. If each load of first to fourth ASICs 1 to 4 is ideally equal, each current flowing through first to fourth ASICs 1 to 4 is also equal.

In adjacent two of the ASICs, the common nodes N2, N4, N6 of the ground electric potential of the higher voltage side ASIC and the electric potential of the power source of the lower voltage side ASIC are connected to the nodes N1, N3, N5 between the battery cells corresponding to the common nodes. Thereby, the electric potential of the power source and the ground electric potential in each ASIC can be stabilized. In this configuration, a part of the wirings is commonly used in the adjacent ASICs. Concretely, as shown in FIG. 1, voltage detection line GND1 as a wiring, connecting node N1 and common node N2, is a common wiring of two ASIC. Here, node N1 is provided between sixth battery cell V6 and seventh battery cell V7, and common node N2 is provided as the common node of the ground electric potential in first ASIC 1 and the electric potential of the power source in second ASIC 2.

First to fourth power source circuits 12 to 42 in first to fourth ASICs 1 to 4 respectively generate a constant voltage of the preset value (for example, 3 to 5 V) from the input power source voltage. The input power source voltage is, for example, 24 V. The DC/DC converter, the three-terminal regulator, or the like can be used as first to fourth power source circuits 12 to 42. The voltages generated by first to fourth power source circuit 12 to 42 are supplied to first to fourth voltage detection circuits 11 to 41, and are used as the power source voltage of first to fourth voltage detection circuits 11 to 41.

The adjacent ASICs out of first to fourth ASICs 1 to 4, are connected by communication lines L1 to L3, respectively. Such a configuration enables first to fourth ASICs 1 to 4 to communicate each other. At least one of first to fourth ASICs 1 to 4 is connected to controlling circuit 7 through insulator interface 6. In this specification, fourth ASIC 4 is connected to controlling circuit 7.

Insulated interface 6 may include a small type of a transformer. By pulse-modulating a communication signal, the communication signal can be level-shifted between a primary side coil and a secondary side coil, while electrically insulating. Also, insulated interface 6 may include a photo-coupler. By sending or receiving optical signals as communication signals, it is easy to electrically insulate without using complicated modulation. On contrast, first to fourth ASICs 1 to 4 are connected through non-insulated interfaces. Those non-insulated interfaces are configured to have electric wiring through level shift circuit, respectively.

Controlling circuit 7 obtains each voltage value of first to twenty-fourth battery cells V1 to V24, through fourth ASIC 4. Such voltage values are detected by first to fourth ASICs 1 to 4. Controlling circuit 7 calculates the remaining capacity (SOC) of the assembled battery based on the obtained voltage values. Further, controlling circuit 7 conducts battery control of equalizing control in the cell voltages or the like, referring to the obtained voltage values. Here, as this specification does not pay attention to equalizing of the cell voltages, circuit configuration of equalizing of the cell voltages is omitted. When controlling circuit 7 detects an abnormal state in any one of the battery cells or disconnection of any one of the voltage detection lines, controlling circuit 7 notifies an upper controller (not shown in figures) of failure detection signal. In the vehicle use, controlling circuit 7 notifies ECU (Electronic Control Unit) through CAN (Control Area Network)—BUS. Controlling circuit 7 is configured of a CPU or a logic circuit, or combination of those.

In first to fourth ASICs 1 to 4, fourth ASIC 4 is directly communicated to controlling circuit 7, and first to third ASIC 1 to 3 are not directly communicated to controlling circuit 7. Fourth ASIC 4 is connected to controlling circuit 7 through communication line L4 and insulated interface 6. As mentioned above, since the transformer or the photo-coupler is used as insulated interface 6, its communication needs larger consumption current than that of communication by the non-insulated interface. Therefore, fourth ASIC 4 has larger consumption current than that of first to third ASICs 1 to 3.

As mentioned above, if each load of first to fourth ASICs 1 to 4 is ideally equal, each current flowing through first to fourth ASICs 1 to 4 is also equal. Generally, each load of first to fourth ASICs 1 to 4 is not equal, each current flowing through first to fourth ASICs 1 to 4 is not equal. Additionally, because of having the insulator interface, the load of fourth ASIC 4 is larger than the loads of the other ASICs (first to third ASICs). Therefore, fourth ASIC 4 has larger consumption current than that of first to third ASICs 1 to 3. Thus, the load of nineteen to twenty-fourth battery cells V19 to V24 connected to fourth ASIC4 is larger than the load of first to eighteen battery cells V1 to V18 connected to first to third ASICs 1 to 3. Then, SOC balance between first to twenty-fourth battery cells V1 to V24 is broken.

In response to this, it is thought that dummy load is connected to first to third ASICs 1 to 3 which is not directly communicated to controlling circuit 7 so as to consume current corresponding to the current consumed by insulated interface 6. In FIG. 1, first to third dummy resistors R1 to R3 are respectively connected to first to third ASICs 1 to 3.

First dummy resistor R1 is not connected between the power source terminal of first ASIC 1 and the ground terminal thereof, but connected between the output terminal of first power source circuit 12 and the ground terminal. Then, the output current of first power source circuit 12 is supplied through first dummy resistor R1. The assembled battery configured of first to twenty-fourth battery cells V1 to V24, is discharged to the load such as the motor or the like, and charged with power supplied by the generator or charging plug, or regenerative energy. The electric potential of the power source and the ground electric potential in each ASIC change by the influence from the charge or discharge of the assembled battery. On contrast, the output voltage of first power source circuit 12 is the constant voltage, and first dummy resistor R1 is connected between the output terminal of first power source circuit 12 and ground terminal. Thus, it reduces the voltage change from the charge or discharge of the assembled battery. The same theory as first dummy resistor R1 is applied to second dummy resistor R2 and third dummy resistor R3.

Since first to third dummy resistors R1 to R3 are connected to first to third ASICs 1 to 3, loads of first to fourth ASICs 1 to 4 approximately become equal. Thus, consumption currents of first to fourth ASICs 1 to 4 also approximately become equal, and naturally the consumption current of the adjacent two ASICs also become equal.

Meanwhile, in the power source device which is configured such that the consumption current of the adjacent two ASICs also become equal, it happens that a current does not flow through the common wiring (for example, voltage detection line GND1). When the load of first ASIC 1 and the load of second ASIC2 are equal, the current flowing through first to sixth battery cell V1 to V6 and the current flowing through seventh to twelfth battery cell V7 to V12 also become equal. At this time, the current flowing through first to sixth battery cell V1 to V6 and the current flowing through seventh to twelve battery cell V7 to V12, flow through the common wiring (voltage detection line GND1) of first ASIC 1 and second ASIC 2. The current values of these currents are approximately equal, but the flowing directions are opposite. As a result, no current flows through the common wiring (=voltage detection line GND1 connecting common node N2 between first ASIC 1 and second ASIC 2, and node N1 between sixth battery cell V6 and seventh battery cell V7. The same theory as voltage detection line GND1 is applied to voltage detection line GND2 and voltage detection line GND2.

When a current does not flow through the voltage detection line, it is difficult that the disconnection of such a line is detected. It is a reason why that its influence cannot be detected at the terminals of the voltage detection circuit when the disconnection happens in a state of no current flowing. As a countermeasure, it is thought that a state of a current flowing through the voltage detection line (the common wiring) is intentionally made by turning on or off a rebalance discharge circuit (not shown in figures) connected to each battery cell. Such a rebalance discharge circuit is a circuit for equalizing SOC in each of battery cells, and is configured of the circuit discharging a discharging current through the voltage detection line. Thus, in a state where the rebalance discharge circuit is operating, as the discharge current flows through the voltage detection line, it is possible to detect the disconnection of the voltage detection line. However, a wasteful energy loss occurs by the discharge current flowing. Additionally, there is a problem that it is impossible to detect at other than detection timing of the discharge current flowing.

As mentioned above, the equal consumption current of the adjacent ASICs causes the state of no current flowing through the common wiring. Therefore, a configuration that causes unbalanced consumption currents in the adjacent ASICs, can intentionally make a state of a current flowing through the common wiring. Concretely, it is thought that first to fourth ASICs 1 to 4 have unbalanced consumption currents. In order that first to fourth ASICs 1 to 4 have unbalanced consumption currents, first to fourth ASICs 1 to 4 have unbalanced loads. However, as mentioned above, the unbalanced loads cause unbalanced SOCs in first to twenty-fourth battery cells V1 to V24. Maintaining the SOC balance and detecting the disconnection of the voltage detection line are contrary each other, but the following embodiment enables both of those.

Figure 2:
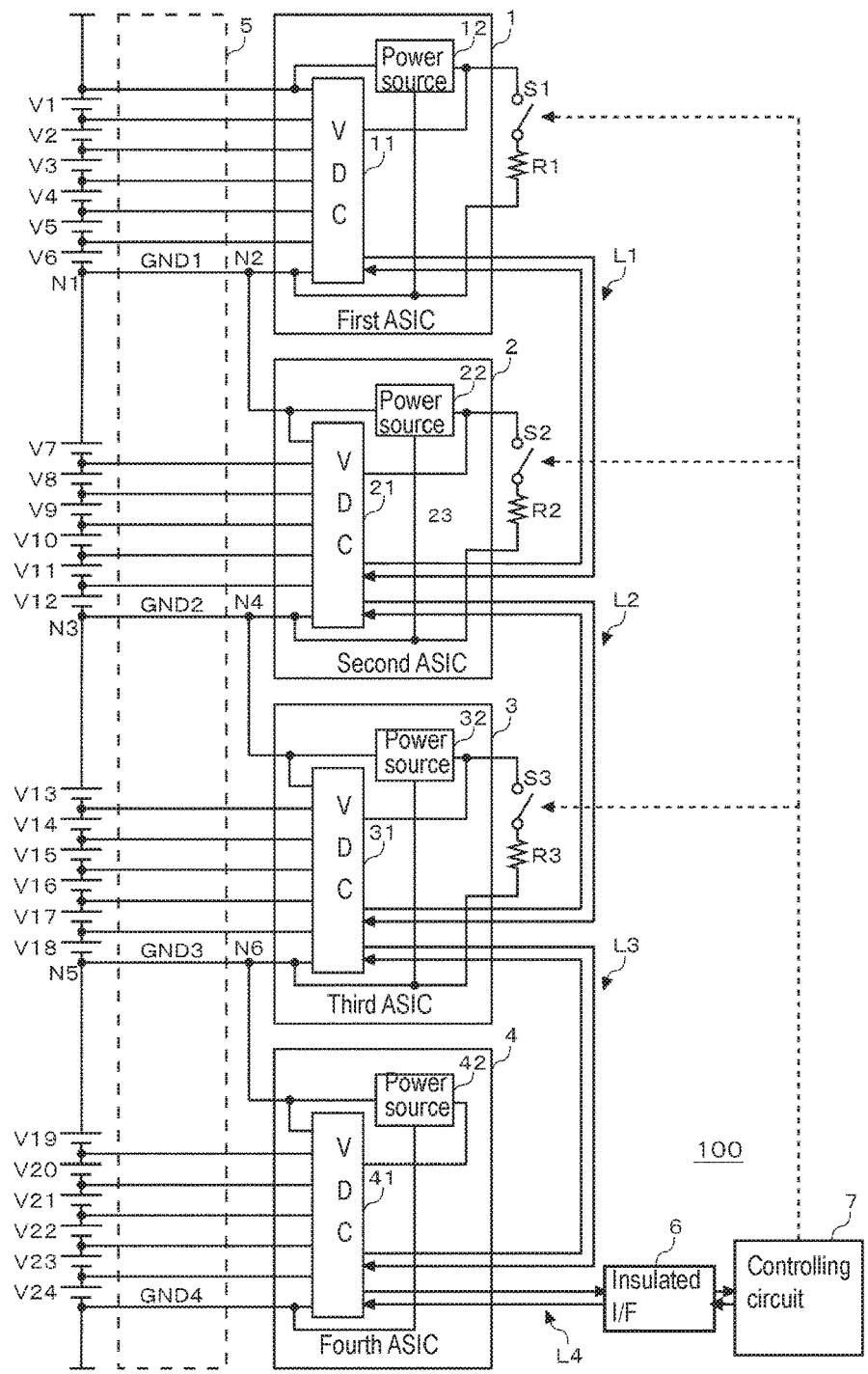
FIG. 2 is a figure showing a configuration of a power supply device relating to an embodiment of a present invention.

FIG. 2 is a figure showing a configuration of a power supply device 100 relating to the embodiment of the present invention. Power source device 100 relating to the embodiment of FIG. 2 has the configuration that first to third switches S1 to S3 are added in order to turn on or off current supplies to first to third dummy resistors R1 to R3. Concrete explanation is made in the following.

First switch S1 is inserted between the output terminal of first power source circuit 12 and first dummy resistor R1, and second switch S2 is inserted between the output terminal of second power source circuit 22 and second dummy resistor R2, and third switch S3 is inserted between the output terminal of third power source circuit 32 and third dummy resistor R3. In FIG. 2, first to third switches S1 to S3 are provided outside first to third ASICs 1 to 3, but those may be installed in the ASIC by using a small type of a semiconductor switch.

Controlling circuit 7 sends switching signals to first to third switches S1 to S3, and carries out on and off control of first to third switches S1 to S3 at arbitrary timings, respectively. In the embodiment, controlling circuit 7 conducts switching control of first to third switches S1 to S3 such that the load currents of first to fourth ASICs 1 to 4 become unbalanced at respective timings, and become equalized during a preset period (for example, 1 to several seconds). The embodiment of the switching control is explained in the following.

Figure 3:
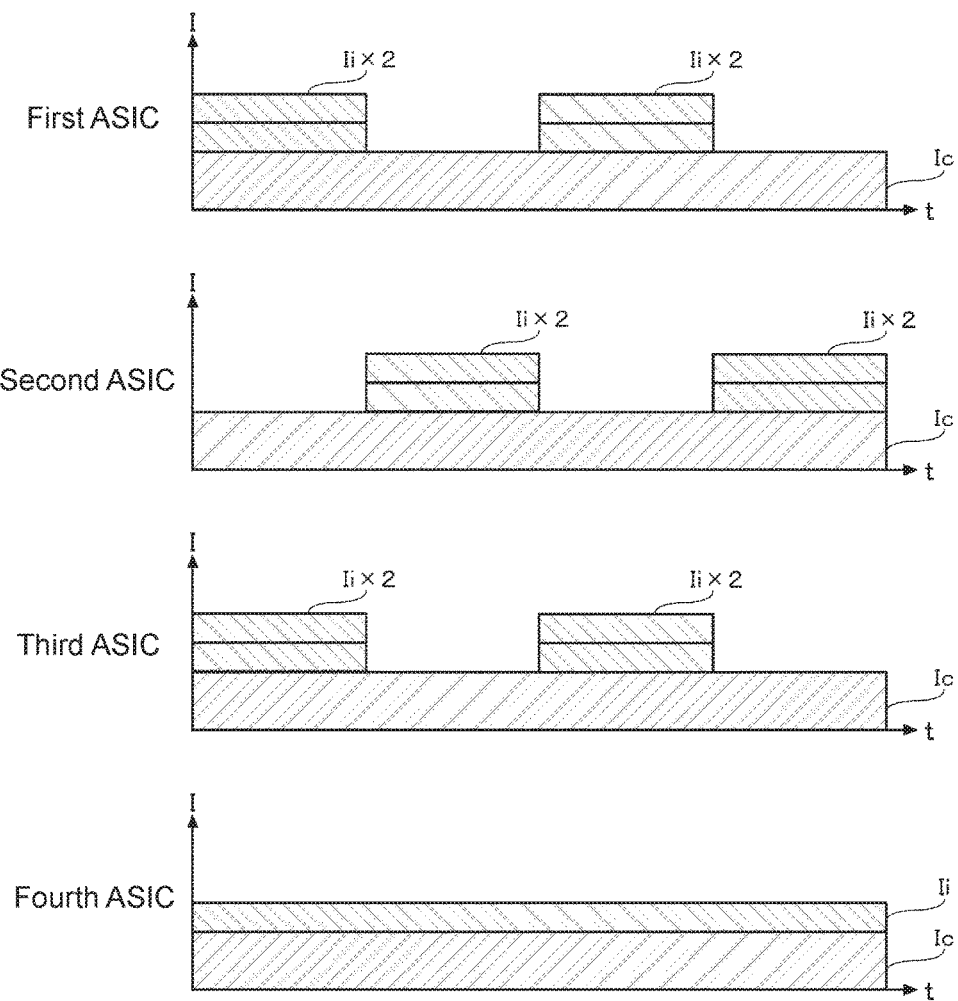
FIG. 3 is a figure showing time transition of consumption current in first to fourth ASICs in a case of applying switching control to first to third switches relating to the embodiment.

FIG. 3 is a figure showing time transition of consumption current in first to fourth ASICs in a case of applying switching control to first to third switches relating to the embodiment. In this embodiment, the resistance value in each of first to third dummy resistors R1 to R3 is set such that the load current thereof is twice as much as a load current (also hereinafter refer to as "additional load current") generated in fourth ASIC 4 by communication to the controlling circuit 7. The additional load current of fourth ASIC 4 is an additionally generated consumption current only in fourth ASIC 4.

The areas shown with left inclined diagonal lines in FIG. 3, respectively indicate consumption currents Ic which are regularly generated by operations of first to fourth voltage detection circuits 11 to 41. This consumption current Ic is fundamentally the same in first to fourth ASICs 1 to 4. The additional consumption current Ii of fourth ASIC 4 is the additionally generated load current in fourth ASIC 4.

Controlling circuit 7 carries out switching control of first to third switches S1 to S3 at a duty ratio of 50%. The ON time and OFF time in each switch are equal at the duty ratio of 50%. Controlling circuit 7 carries out switching control of switches at a phase difference of 180 degrees between the adjacent two ASICs out of first to third ASICs 1 to 3. In this embodiment, first switch S1 of first ASIC 1 and second switch S2 of second ASIC 2 operate at opposite phase each other. Namely, the control is carried out such that one switch is the ON state and the other switch is the OFF state. The relationship of second switch S2 of second ASIC 2 and third switch S3 of third ASIC 3 is the same way.

Figure 4:
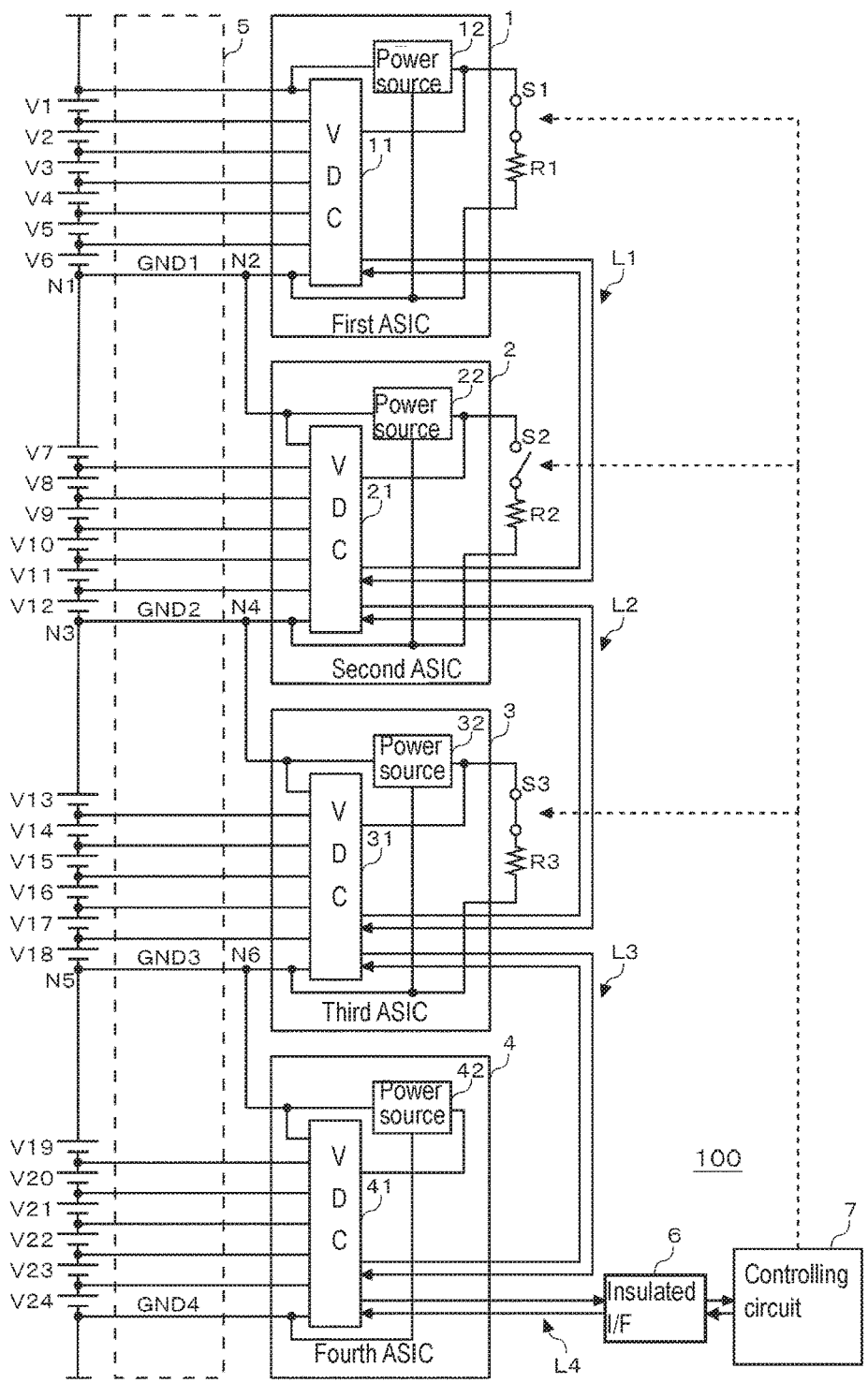
FIG. 4 is a figure showing a state of an electric circuit in the power source device in a case of applying switching control to the first to third switches relating to the embodiment.

FIG. 4 is a figure showing a state of an electric circuit in power source device 100 in a case of applying switching control to the first to third switches S1 to S3 relating to the embodiment. As shown in FIG. 4, first to third switches S1 to S3 are alternately turns on or off. In FIG. 4, switching control is carried out in the state where first switch S1 and third switch S3 are in the ON state, and second switch S2 is in the OFF state. In the next period, switching control is carried out in the state where first switch S1 and third switch S3 are in the OFF state, and second switch S2 is in the ON state. Then, after that, those two states are alternatively switched. Controlling circuit 7 switches the two states in the preset period (for example, 1 second or 2 seconds).

As shown in FIG. 3, in the ASIC in the ON state of the switch, the current twice as much as the additional consumption current Ii in fourth ASIC 4 is consumed at the dummy resistor. In order to control not to overlap the ON time durations of the adjacent ASICs, the consumption current of second ASIC 2 does not increase for the duration when the consumption current of first ASIC 1 increases. In contrast, the consumption current of first ASIC 1 does not increase for the duration when the consumption current of second ASIC 2 increases. The relationship of second switch S2 of second ASIC 2 and third switch S3 of third ASIC 3 is the same way.

At the respective timings, the load currents of first to fourth ASICs 1 to 4 become unbalanced. But the load currents of first to fourth ASICs 1 to 4 become equalized during one cycle (per one period). Thus, the SOC balance of first to twenty-fourth battery cells V1 to V24 can be maintained. Further, at the respective timings, the consumption currents in the adjacent two ASICs are different, and then the electrical potentials at the common nodes N2, N4, N6 can be shifted to higher or lower than the electrical potentials of the nodes N1, N3, N5 corresponding to between the battery cells. Then, the current can be made flow through voltage detection lines GND1, GND2, GND3 connected to the nodes N1, N3, N5 corresponding to between the battery cells, the disconnection of voltage detection lines GND1, GND2, GND3 can be detected with a high accuracy. Since such a current always flows, the disconnection can be always detected without the duration when it is impossible to detect the disconnection.

According to the power supply device relating to the embodiment, it is hard that the SOC balance between battery cells is broken, and it is easy to detect the disconnection of the voltage detection line. Such a power supply device system can be established. The energy loss by equalization control between the battery cells can be minimized.

The above explanation is made based on the embodiments of the present invention. The person of the ordinary skill in the art can understand that these embodiments are illustrated, and these constitution elements and these combined processes can be modified, and such modified examples are covered by the scope of the present invention.

In the above-mentioned embodiment, the consumption current of the dummy resistor is set at the value twice as much as the additional consumption current of the ASIC which directly communicated to controlling circuit 7. Then, switching control of first to third switches S1 to S3 is carried out at the duty ratio of 50%. In this point, when the consumption current of the dummy resistor is set at the value of three times and switching control is carried out at the duty ratio of 33.3%, the same effect as the above-mentioned embodiment is obtained. Thus, it is possible to set many values in the combination of the resistance value of the dummy resistor and the duty ratio of first to third switches S1 to S3. Preferably, the duty ratio of first to third switches S1 to S3 is 50% or less. In a case of more than 50% in the duty ratio, the duration occurs when the consumption currents in the adjacent two ASICs become equal, and in such a duration, it is difficult to detect the disconnection of voltage detection line GND1, GND2, GND3.

Here, in a case where the resistance values of first to third dummy resistors R1 to R3 are set respectively, even at the duty ratio of more than 50%, it is possible not to generate the duration when the consumption currents in the adjacent two ASICs become equal. Namely, the ASIC having a large resistance value and a large duty ratio and the ASIC having a small resistance value and a small duty ratio, are disposed adjacent to each other.

In the above-mentioned embodiment, power source device 100 is used as a secondary battery for a vehicle. But, it is not limited to be used for the vehicle, and it is also used for a stationary power storage system.

The invention claimed is:

1. A battery management device comprising:
   a plurality of cascade-connected voltage detection ICs (Integrated Circuits) for detecting each voltage of a plurality of battery cells connected in series and constituting an assembled battery, through a plurality of voltage detection lines;
   power sources receiving power from the assembled battery, for supplying power to the plurality of the voltage detection ICs;
   communication lines connecting between the plurality of the voltage detection ICs;
   a controlling circuit connected to at least one of the plurality of the voltage detection ICs through a communication line;
   a dummy resistor connected to each of one or more of the voltage detection ICs which are not directly communicated to the controlling circuit out of the plurality of the voltage detection ICs: and
   a switch turning on or off current supply through the dummy resistor,
   wherein in adjacent two of the voltage detection ICs, a ground electric potential of the higher voltage side voltage detection IC and an electric potential of the power source of the lower voltage side voltage detection IC are connected, and the connected node and a node connected between the battery cells corresponding to the connected node are connected through the voltage detection line, and
   in the plurality of the voltage detection ICs, the at least one of the voltage detection ICs, which are directly communicated to the controlling circuit, is not connected to the dummy resistor and the switch turning on or off current supply through the dummy resistor.

2. The battery management device according to claim 1, wherein each of the voltage detection ICs includes a power source circuit as the power source which generates a constant voltage of a preset voltage value from an input power source voltage, and
   the power source circuit supplies a current to the dummy resistor.

3. The battery management device according to claim 1, wherein switching in the switch of each of the one or more of the voltage detection ICs which are not directly communicated to the controlling circuit, is carried out such that load currents of the plurality of the voltage detection ICs at the same timing become unequal and the load currents thereof during a predetermined time length are equalized.

4. The battery management device according to claim 1, wherein the dummy resistor is set such that the load current thereof is twice as much as a load current by communication to the controlling circuit in each of the at least one of the voltage detection ICs which are directly communicated to the controlling circuit, and
   wherein switching in the switch of each of the one or more of the voltage detection ICs which are not directly communicated to the controlling circuit, is carried out at a duty ratio of 50% and a phase difference of 180 degrees between the adjacent voltage detection ICs.

5. A power supply device comprising:
   the assembled battery in which the plurality of the battery cells are connected in series; and
   the battery management device according to claim 1 for managing the assembled battery.

* * * * *